United States Patent
Miyanaga et al.

(10) Patent No.: US 9,529,054 B2
(45) Date of Patent: Dec. 27, 2016

(54) DETECTING DISCONNECTION FAULT IN DEVICE MONITORING CIRCUIT CONNECTED IN MULTIPLE STAGES FOR BATTERY CELLS CONNECTED IN SERIES

(71) Applicant: ROHM CO., LTD., Kyoto (JP)

(72) Inventors: Koichi Miyanaga, Kyoto (JP); Jun Maede, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 132 days.

(21) Appl. No.: 14/258,145

(22) Filed: Apr. 22, 2014

(65) Prior Publication Data

US 2014/0320071 A1    Oct. 30, 2014

(30) Foreign Application Priority Data

Apr. 24, 2013   (JP) .................................. 2013-091142

(51) Int. Cl.
*G01R 31/36* (2006.01)
*H02J 7/00* (2006.01)

(52) U.S. Cl.
CPC ......... *G01R 31/3658* (2013.01); *H02J 7/0016* (2013.01); *H02J 7/0021* (2013.01); *G01R 31/362* (2013.01); *Y02T 10/7055* (2013.01)

(58) Field of Classification Search
CPC .. G01R 31/3658; G01R 31/362; H02J 7/0021; H02J 7/0016; Y02T 10/7055
See application file for complete search history.

(56) References Cited

U.S. PATENT DOCUMENTS

| | | | | |
|---|---|---|---|---|
| 4,394,741 A * | 7/1983 | Lowndes | ............ | B60L 11/1853 320/100 |
| 5,825,155 A * | 10/1998 | Ito | ............ | G01R 19/16542 320/118 |
| 5,925,990 A * | 7/1999 | Crouse | ............ | H05B 41/2855 315/127 |
| 6,271,643 B1 * | 8/2001 | Becker | ............ | H02J 9/061 320/112 |
| 6,388,423 B1 * | 5/2002 | Schilleci, Jr. | ......... | H02J 7/0021 320/116 |
| 6,404,166 B1 * | 6/2002 | Puchianu | ............ | B60L 3/0046 320/116 |
| 6,836,098 B1 * | 12/2004 | O'Brien | ............ | H02J 7/0016 320/166 |

(Continued)

FOREIGN PATENT DOCUMENTS

JP    2007-129864 A    5/2007

*Primary Examiner* — Naum B Levin
(74) *Attorney, Agent, or Firm* — Cantor Colburn LLP

(57) ABSTRACT

An electrical storage device monitoring circuit includes a 3-state buffer configured to switch between a high output state and a low output state based on a flag output delivered from a previous electrical storage device monitoring circuit at a front stage, and also configured to detect a disconnection between the current electrical storage device monitoring circuit and the previous electrical storage device monitoring circuit at the front stage; a detection circuit configured to monitor an electrical storage device to detect whether the electrical storage device is normal or abnormal; and an output circuit configured to deliver the flag output to a subsequent electrical storage device monitoring circuit at a next stage based on an input of the 3-state buffer and a detection result of the detection circuit.

9 Claims, 15 Drawing Sheets

(56) References Cited

U.S. PATENT DOCUMENTS

| | | | | |
|---|---|---|---|---|
| 7,274,170 B2* | 9/2007 | Benckenstein, Jr. | H02J 7/0016 | 320/119 |
| 7,417,405 B2* | 8/2008 | Carrier | H02J 7/0021 | 320/116 |
| 7,615,966 B2* | 11/2009 | Houldsworth | H02J 7/0016 | 320/118 |
| 8,030,893 B2* | 10/2011 | Nakatsuji | H01M 10/441 | 320/116 |
| 8,030,898 B2* | 10/2011 | Okuto | H02J 7/0014 | 320/134 |
| 8,421,413 B2* | 4/2013 | Mizoguchi | G01R 31/3658 | 320/119 |
| 8,699,193 B2* | 4/2014 | Mizuno | H02H 7/12 | 361/88 |
| 8,803,456 B2* | 8/2014 | Zushi | H02H 7/122 | 318/400.22 |
| 8,806,240 B2* | 8/2014 | Kim | H02J 3/32 | 320/127 |
| 8,823,206 B2* | 9/2014 | Omoto | B60L 3/0046 | 307/9.1 |
| 8,963,369 B2* | 2/2015 | Sella | H01L 31/02021 | 136/244 |
| 2002/0101218 A1* | 8/2002 | Koenck | G01R 31/3655 | 320/140 |
| 2005/0212493 A1* | 9/2005 | Yamaguchi | H02J 7/0024 | 320/166 |
| 2008/0252257 A1* | 10/2008 | Sufrin-Disler | B60L 3/0046 | 320/118 |
| 2009/0051324 A1* | 2/2009 | Nakatsuji | H01M 10/441 | 320/134 |
| 2009/0206666 A1* | 8/2009 | Sella | H01L 31/02021 | 307/43 |
| 2011/0156714 A1* | 6/2011 | Mizoguchi | G01R 31/3658 | 324/434 |
| 2012/0063180 A1* | 3/2012 | Mizuno | H02H 7/12 | 363/50 |
| 2012/0293021 A1* | 11/2012 | Teggatz | H02J 7/35 | 307/151 |
| 2013/0119935 A1* | 5/2013 | Sufrin-Disler | B60L 3/0046 | 320/116 |
| 2013/0278191 A1* | 10/2013 | Zushi | H02H 7/122 | 318/400.22 |

* cited by examiner

FIG. 6

| 3-state input | Output of Detection Circuit | Flag output F |
|---|---|---|
| H or Hiz | . | $I_1$ ON |
| L | H | $I_1$ ON |
| L | L | $I_1$ OFF |

FIG. 11

| 3-state input | Flag output F1 | Flag output F2 |
|---|---|---|
| H | I1 ON | I2 OFF |
| L | I1 OFF | I2 OFF |
| Hiz | I1 OFF | I2 ON |

1

DETECTING DISCONNECTION FAULT IN DEVICE MONITORING CIRCUIT CONNECTED IN MULTIPLE STAGES FOR BATTERY CELLS CONNECTED IN SERIES

CROSS-REFERENCE TO RELATED APPLICATION

This application is based upon and claims the benefit of priority from Japanese Patent Application No. 2013-091142, filed on Apr. 24, 2013, the entire contents of which are incorporated herein by reference.

TECHNICAL FIELD

The present disclosure relates to an electrical storage device monitoring circuit, a charging system, and an integrated circuit.

BACKGROUND

In general, an assembled battery such as a lithium ion battery in which a plurality of battery cells (electrical storage devices) are connected in series is used as a large capacity high output battery to drive a motor of a hybrid vehicle or an electric vehicle, or the like. In the assembled battery, a monitoring circuit may be used to monitor and control a voltage of each of the battery cells.

Monitoring circuits are connected in multiple stages through wiring such as a flat cable. Such wiring may be disconnected depending on an insertion state, or the like, but conventionally, a disconnection fault cannot be detected.

SUMMARY

The present disclosure provides some embodiments of an electrical storage device monitoring circuit capable of detecting a disconnection fault, a charging system, and an integrated circuit.

According to one embodiment of the present disclosure, there is provided an electrical storage device monitoring circuit, including: a 3-state buffer configured to switch between a high output state and a low output state based on a flag output delivered from a previous electrical storage device monitoring circuit at a front stage, and also configured to detect a disconnection between the electrical storage device monitoring circuit and the previous electrical storage device monitoring circuit at the front stage; a detection circuit configured to monitor an electrical storage device to detect whether the electrical storage device is normal or abnormal; and an output circuit configured to deliver the flag output to a subsequent electrical storage device monitoring circuit at a next stage based on an input of the 3-state buffer and a detection result of the detection circuit.

According to another embodiment of the present disclosure, there is provided a charging system, including: a charging unit configured to generate a charge current; a plurality of electrical storage devices connected in series to the charging unit; multistage-connected electrical storage device monitoring circuits configured to monitor the electrical storage devices to detect whether they are normal or abnormal, each of the electrical storage devices being configured to detect a disconnection fault between the electrical storage device monitoring circuit and a previous electrical storage device monitoring circuit at a front stage; and a control circuit configured to monitor an output signal of a final stage of the multistage-connected electrical storage device monitoring circuits.

According to another embodiment of the present disclosure, there is provided an integrated circuit including the electrical storage device monitoring circuit as described above.

BRIEF DESCRIPTION OF THE DRAWINGS

FIG. 6 is a view illustrating an input/output logic of the electrical storage device monitoring circuit according to the first embodiment.

FIG. 11 is a view illustrating an input/output logic of the electrical storage device monitoring circuit according to the second embodiment.

DETAILED DESCRIPTION

Embodiments of the present disclosure will now be described in detail with reference to the drawings. In the following description of the drawings, like or similar references numerals are used for like or similar parts. However, it should be noted that the drawings are schematic, and the relationships between the thicknesses and flat dimensions of respective constituent parts, or the like are different from those that are actually made. Thus, the specific thicknesses or dimensions should be determined based on the following description. Also, it should be understood that different relationships or ratios between mutual dimensions of the drawings are included.

Further, in the embodiments that follow, the apparatuses or methods to embody the technical idea of the present disclosure are illustrated, and the materials, features, structures, arrangements, or the like of the respective constituent parts in the embodiments of the present disclosure are not specified to those as set below. Various changes to the embodiments of the present disclosure may be made in the claims.

First Embodiment

Hereinafter, a first embodiment will be described in detail with reference to FIGS. 1 to 8.
<Charging System>

Figure 1:
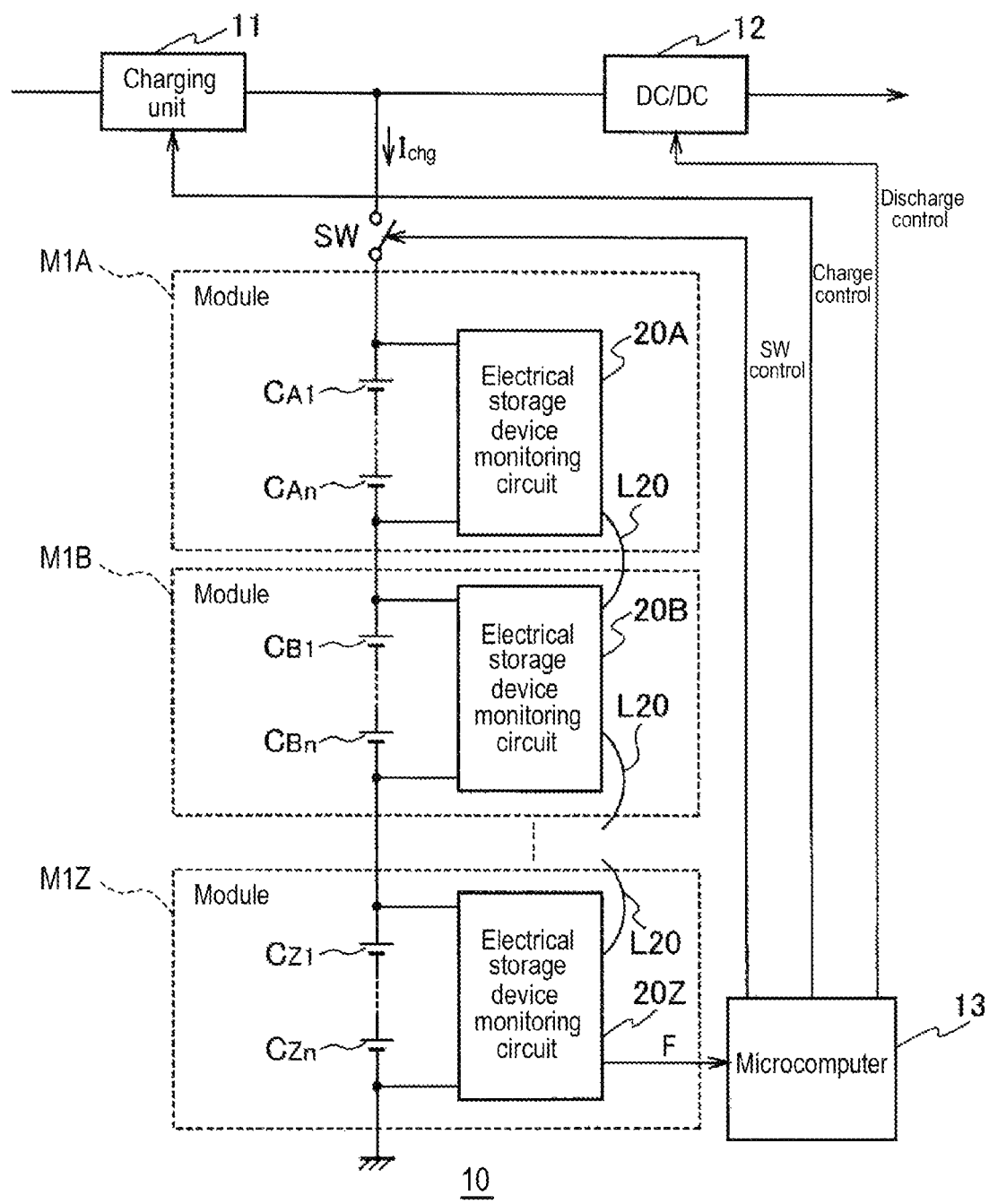
FIG. 1 is a schematic block diagram illustrating a configuration of a charging system according to a first embodiment.

As illustrated in FIG. 1, a charging system 10 according to a first embodiment includes a charging unit 11 for generating a charge current $I_{chg}$, a plurality of electrical storage devices $C_{A1}$ to $C_{An}$, $C_{B1}$ to $C_{Bn}$, ..., $C_{Z1}$ to $C_{Zn}$ connected in series to the charging unit 11, and electrical storage device monitoring circuits 20A, 20B, ..., 20Z connected in multiple stages through wirings L20. The electrical storage device monitoring circuits 20A, 20B, ..., 20Z are connected to the electrical storage devices $C_{A1}$ to $C_{An}$, $C_{B1}$ to $C_{Bn}$, ..., $C_{Z1}$ to $C_{Zn}$, respectively. Each of the electrical storage device monitoring circuits 20A, 20B, ..., 20Z detects whether its corresponding electrical storage device is operating in a normal state or an abnormal state. Each of the electrical storage device monitoring circuits 20A, 20B, ..., 20Z also detects its disconnection abnormality to a previous electrical storage device monitoring circuit at a front stage. The charging system 10 also includes a microcomputer (control circuit) 13 for monitoring an output signal of the electrical storage device monitoring circuit 20Z at a final stage of the multistage-connected electrical storage device monitoring circuits 20A, 20B, ..., 20Z. The microcomputer 13 may control an ON/OFF operation of a switch SW installed in a supply line of the charge current $I_{chg}$, a charging operation of the charging unit 11, a discharging operation of a DC/DC converter 12, and the like. Various systems such as an electric vehicle (not shown) are connected to a next stage of the DC/DC converter 12. The electrical storage devices $C_{A1}$ to $C_{An}$, $C_{B1}$ to $C_{Bn}$, ..., $C_{Z1}$ to $C_{Zn}$ may be, for example, a lithium ion battery cell, an electric double layer capacitor cell, a lithium ion capacitor cell, SCiB® cell, or the like.

Here, the electrical storage devices $C_{A1}$ to $C_{An}$ and the electrical storage device monitoring circuit 20A are modularized to form a module M1A. This is also the same to the other electrical storage devices $C_{B1}$ to $C_{Bn}$, ..., $C_{Z1}$ to $C_{Zn}$ and the electrical storage device monitoring circuits 20B, ..., 20Z. The electrical storage device monitoring circuits 20A, 20B, ..., 20Z are connected in multiple stages through wirings L20. When one of the wirings L20 is disconnected, the disconnection abnormality may be detected and recovered.

Comparative Example 1

Register Type

Figure 2:
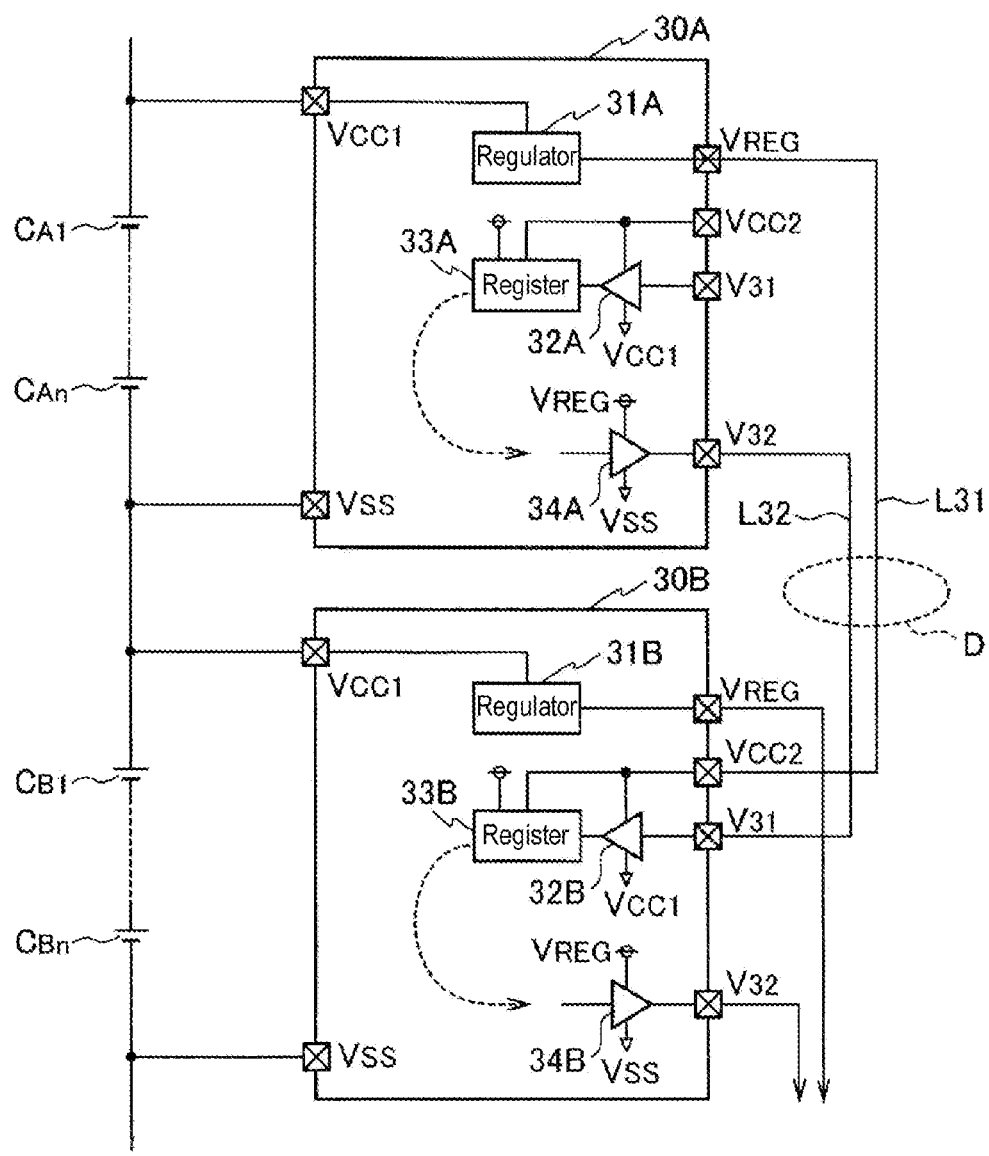
FIG. 2 is a schematic block diagram illustrating a configuration of an electrical storage device monitoring circuit according to Comparative Example 1.

As illustrated in FIG. 2, an electrical storage device monitoring circuit 30B according to Comparative Example 1 includes a regulator 31B, a register 33B, and amplifying circuits 32B and 34B. Each of electrical storage device monitoring circuits 30A, 30B, ..., 30Z has a monitoring function of monitoring (detecting) abnormality such as overcharge, overdischarge, or overcurrent, and delivers a detection flag as a detection result to a next stage through serial communication such as an inter-integrated circuit.

For example, the detection flag detected by the electrical storage device monitoring circuit 30A is delivered to the electrical storage device monitoring circuit 30B at the next stage through a wiring L32 and stored in the register 33B of the electrical storage device monitoring circuit 30B. The electrical storage device monitoring circuit 30B reads the detection flag stored in the register 33B, and delivers the read detection flag to the electrical storage device monitoring circuit 30C at the next stage in the same manner. Accordingly, the microcomputer 13 may monitor an output signal from the electrical storage device monitoring circuit 30Z at the final stage to detect abnormality such as overcharge. However, disconnection may occur in wirings L31 and L32 for connecting the respective electrical storage device monitoring circuits 30A, 30B, ..., 30Z in a portion indicated by reference character D in FIG. 2, for example. In this case, the disconnection D may not be detected, and thus, an appropriate recovery processing may not be performed in Comparative Example 1.

Comparative Example 2

Simple Scheme

Figure 3:
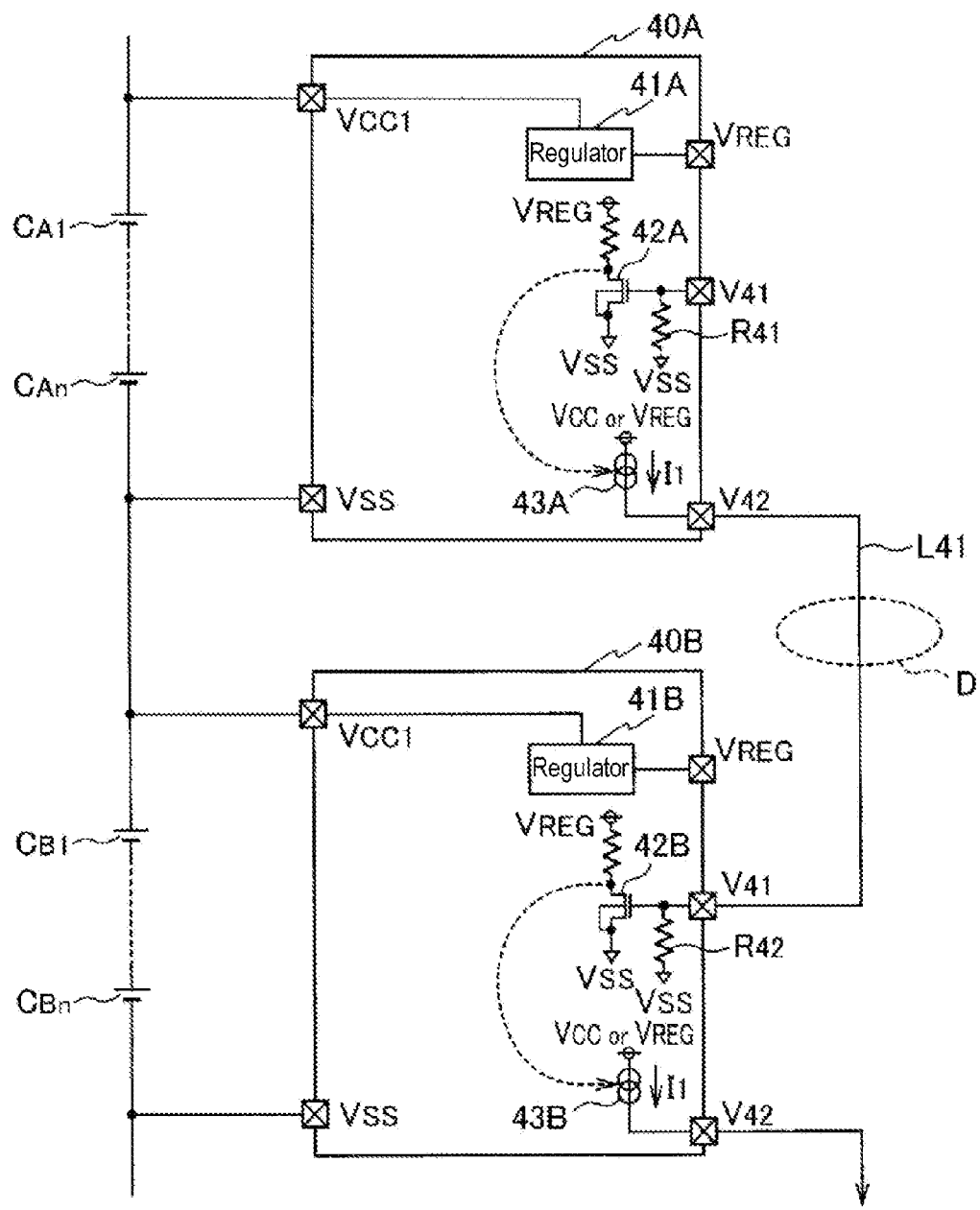
FIG. 3 is a schematic block diagram illustrating a configuration of an electrical storage device monitoring circuit according to Comparative Example 2.

As illustrated in FIG. 3, an electrical storage device monitoring circuit 40B according to Comparative Example 2 includes a regulator 41B, a transistor 42B, and an output circuit 43B. A pull-down resistor R42 is inserted between an input terminal V41 and a terminal VSS. Each of electrical storage device monitoring circuits 40A, 40B, ..., 40Z has a monitoring function, similar to that of Comparative Example 1.

Comparative Example 2 is different from Comparative Example 1 in that it does not have a register for storing a detection flag. That is, when abnormality is detected, the output circuit 43B allows a current $I_1$ to flow, while when abnormality is not detected, the output circuit 43B does not allow the current $I_1$ to flow. Accordingly, the microcomputer 13 may monitor the current $I_1$ (flag output) output from the electrical storage device monitoring circuit 40Z at the final stage to detect abnormality such as overcharge. According to Comparative Example 2 using the above-described current interface, a level shifting is easy, compared to Comparative Example 1 using the voltage interface. However, even in Comparative Example 2, the disconnection D cannot be detected, and thus, an appropriate recovery processing may not be performed.

<Electrical Storage Device Monitoring Circuit: Simple Scheme>

Figure 4:
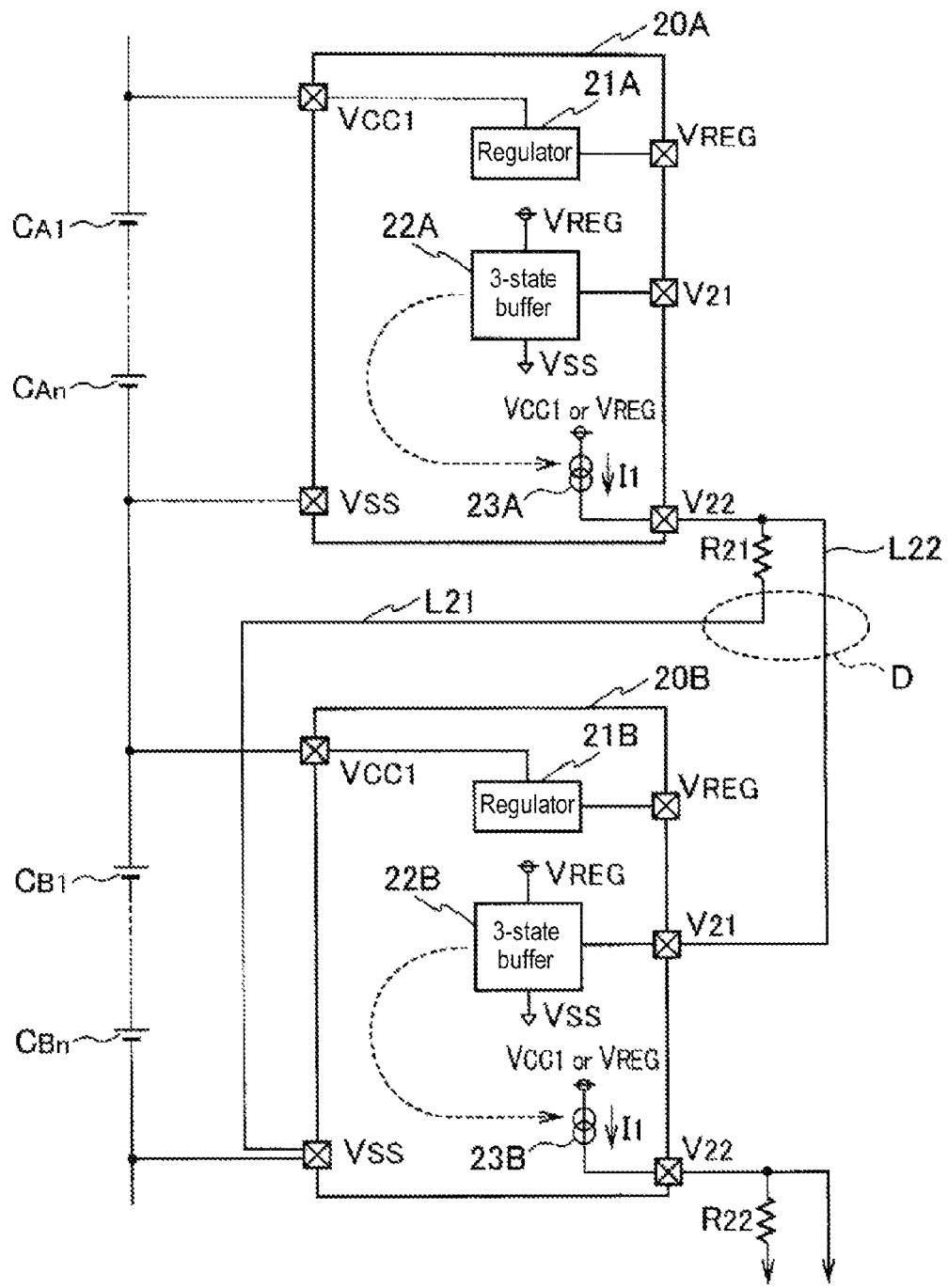
FIG. 4 is a schematic block diagram illustrating a configuration of an electrical storage device monitoring circuit according to the first embodiment.
Figure 5:
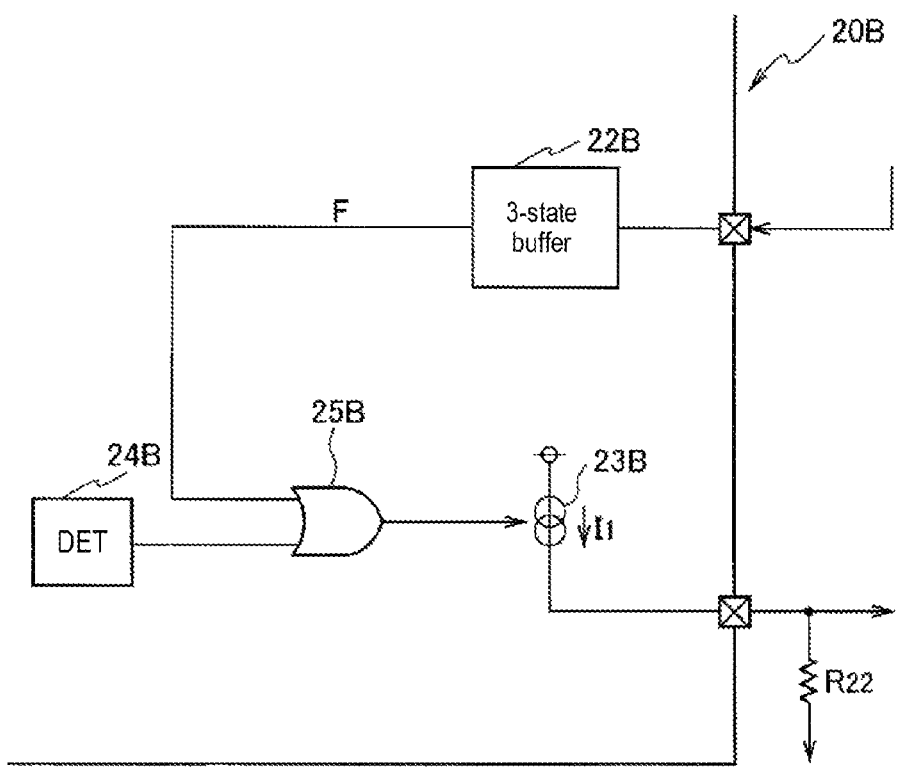
FIG. 5 is a schematic block diagram illustrating a detailed configuration of a major part of the electrical storage device monitoring circuit illustrated in FIG. 4.

A schematic block diagram illustrating a configuration of the electrical storage device monitoring circuit 20B according to the first embodiment is illustrated in FIG. 4, and a detailed schematic block diagram of a major part thereof is illustrated in FIG. 5. Here, the electrical storage device monitoring circuit 20B will be mainly described, but the other electrical storage device monitoring circuits 20A, 20C, ..., 20Z are no different. In the following description, the electrical storage device monitoring circuits 20A, 20B, ..., 20Z may be collectively referred to as "electrical storage device monitoring circuits 20."

Like in Comparative Example 2, the electrical storage device monitoring circuit 20B according to the first embodiment employs a simple scheme without a register. There are two significant differences from Comparative Example 2: one is that it employs a 3-state buffer, and the other is a disposition of a pull-down resistor. The 3-state buffer is a circuit for outputting high/low for a 3-state input (high/low/high impedance). Further, the pull-down resistor refers to a resistor inserted between a ground terminal and an input terminal to make an input level to be closer to a ground level.

That is, as illustrated in FIGS. 4 and 5, the electrical storage device monitoring circuit 20B according to the first embodiment includes a 3-state buffer 22B, a detection circuit 24B, and an output circuit 23B. The 3-state buffer 22B switches between a high output state and a low output state based on a flag output F delivered from the electrical storage device monitoring circuit 20A at the front stage, and detects a disconnection D between the electrical storage device monitoring circuit 20B and the electrical storage device monitoring circuit 20A at the front stage. The detection circuit 24B monitors electrical storage devices $C_{B1}$ to $C_{Bn}$ to detect normality or abnormality. For example, the detection circuit 24B monitors (detects) abnormality such as overcharge, overdischarge, or overcurrent. When the abnormality is detected, the detection circuit 24B outputs a high level signal while in other cases, the detection circuit 24B outputs a low level signal. The output circuit 23B delivers a flag output F to the electrical storage device monitoring circuit 20C at the next stage based on the input of the 3-state buffer 22B and the detection result of the detection circuit 24B.

Specifically, when the input of the 3-state buffer 22B is high or high impedance, the 3-state buffer 22B turns on the flag output F, and when the input of the 3-state buffer 22B is low, the 3-state buffer 22B turns off the flag output F. Further, when an output from the detection circuit 24B is a high level or the flag output F of the 3-state buffer 22B is a high level, an output from an OR circuit 25B is a high level, and the output circuit 23B allows a current $I_1$ to flow. Further, when the output from the detection circuit 24B is a low level and the flag output F of the 3-state buffer 22B is a low level, the output from the OR circuit 25B is a low level and the output circuit 23B does not allow the current $I_1$ to flow. Accordingly, the microcomputer 13 may monitor the flag output F output from the electrical storage device monitoring circuit 20Z at the final stage, thus detecting a disconnection fault, as well as an operating fault (abnormality) such as overcharge.

As illustrated in FIG. 4, the VSS terminal of the electrical storage device monitoring circuit 20B is connected to an output terminal V22 of the electrical storage device monitoring circuit 20A at the front stage through a wiring L21. A pull-down resistor R21 used for the 3-state buffer 22B is inserted into the wiring L21. Also, an input terminal V21 of the electrical storage device monitoring circuit 20B is connected to the output terminal V22 of the electrical storage device monitoring circuit 20A at the front stage through a wiring L22. A regulator 21B is interposed between a VCC1 terminal and a VREG terminal, similar to that in Comparative Example 1 or Comparative Example 2.

Here, the pull-down resistor R21 used for the 3-state buffer 22B is disposed in the vicinity of the electrical storage device monitoring circuit 20A at the front stage. The vicinity means that the pull-down resistor R21 is positioned at the electrical storage device monitoring circuit 20A side, rather than at a position where the disconnection D is easily made. Specifically, the pull-down resistor R21 may be disposed in a module M1A in which the electrical storage device monitoring circuit 20A at the front stage is mounted (to be described later). Accordingly, even when the disconnection D occurs between the electrical storage device monitoring circuit 20B and the electrical storage device monitoring circuit 20A at the front stage, an output state of the 3-state buffer 22B is prevented from being fixed to a low level.

<Input/Output Logic>

An input/output logic of the electrical storage device monitoring circuit 20B according to the first embodiment is illustrated in FIG. 6. As illustrated in FIG. 6, when an input of the 3-state buffer 22B is a high level or high impedance, the flag output F is turned on. Further, when the input of the 3-state buffer 22B is low and the output of the detection circuit 24B is high, the flag output F is turned on. However, when the input of the 3-state buffer 22B is low and the output of the detection circuit 24B is low, the flag output F is turned off.

Turning on the flag output F corresponds to the output circuit 23B allowing the current $I_1$ to flow. And, turning off the flag output F corresponds to the output circuit 23B not allowing the current $I_1$ to flow. Accordingly, the microcomputer 13 may monitor the current $I_1$ (flag output F) output from the electrical storage device monitoring circuit 20Z at the final stage, thus detecting a disconnection fault, as well as an operating fault such as overcharge.

<Example of Multi-Stage Connection>

Figure 7:
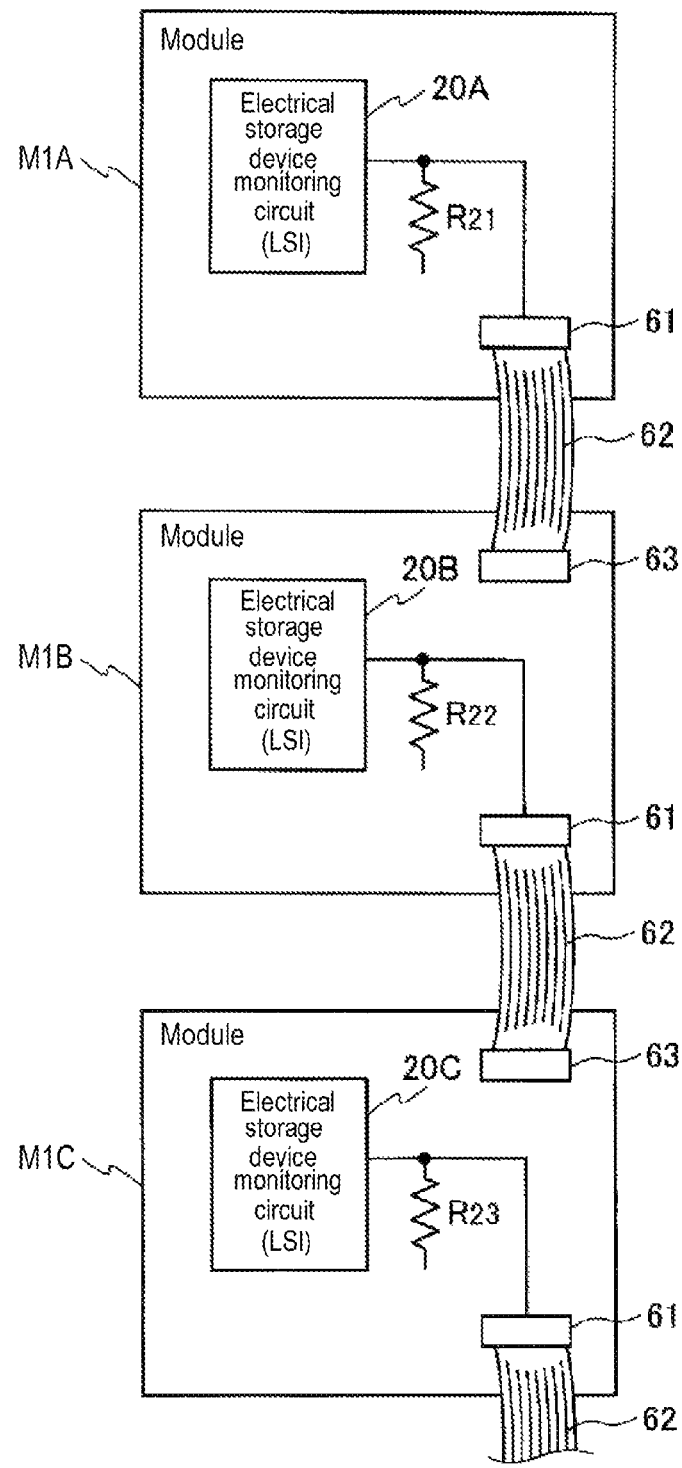
FIG. 7 is a view illustrating a specific example of how the electrical storage device monitoring circuit according to the first embodiment is connected in multiple stages.

A specific example of multi-stage connection of the electrical storage device monitoring circuits 20A, 20B, . . . , 20Z according to the first embodiment is illustrated in FIG. 7. As illustrated in FIG. 7, the electrical storage device monitoring circuits 20A, 20B, . . . , 20Z are mounted on separate modules M1A, M1B, . . . , M1Z, respectively. A connector 61 installed in one end of a flat cable 62 is inserted into the module M1A in which the electrical storage device monitoring circuit 20A is mounted. Also, a connector 63 installed in the other end of the flat cable 62 is inserted into the module M1B in which the electrical storage device monitoring circuit 20B is mounted. The flat cable 62 is an example of the wiring L20. There is a possibility that the flat cable 62 is disconnected according to an insertion state, or the like. When the flat cable 62 is disconnected, the disconnection fault is detected and a recovery processing may be performed.

<Example of Recovery Processing>

Next, a recovery processing of the charging system 10 according to the first embodiment will be described with reference to FIG. 1.

For example, when the flag output F is in an ON state, the microcomputer 13 turns off the switch SW installed in the supply line of the charge current $I_{chg}$. Accordingly, when the wiring L20 is disconnected, the supply of the charge current $I_{chg}$ may be stopped. Such recovery processing is effective if there is no problem when a system at the next stage of the DC/DC converter 12 and the electrical storage devices $C_{A1}$ to $C_{An}$, $C_{B1}$ to $C_{Bn}$, . . . , $C_{Z1}$ to $C_{Zn}$ are decoupled.

Also, when the flag output F is in an ON state, the microcomputer 13 may control the charging unit 11 to lower the charge current $I_{chg}$. Accordingly, when the wiring L20 is disconnected, a charge voltage may be lowered to prevent overvoltage. Such recovery processing is effective when the system at the next stage of the DC/DC converter 12 and the electrical storage devices $C_{A1}$ to $C_{An}$, $C_{B1}$ to $C_{Bn}$, . . . , $C_{Z1}$ to $C_{Zn}$ cannot be decoupled.

<Modified Example of Module>

Figure 8:
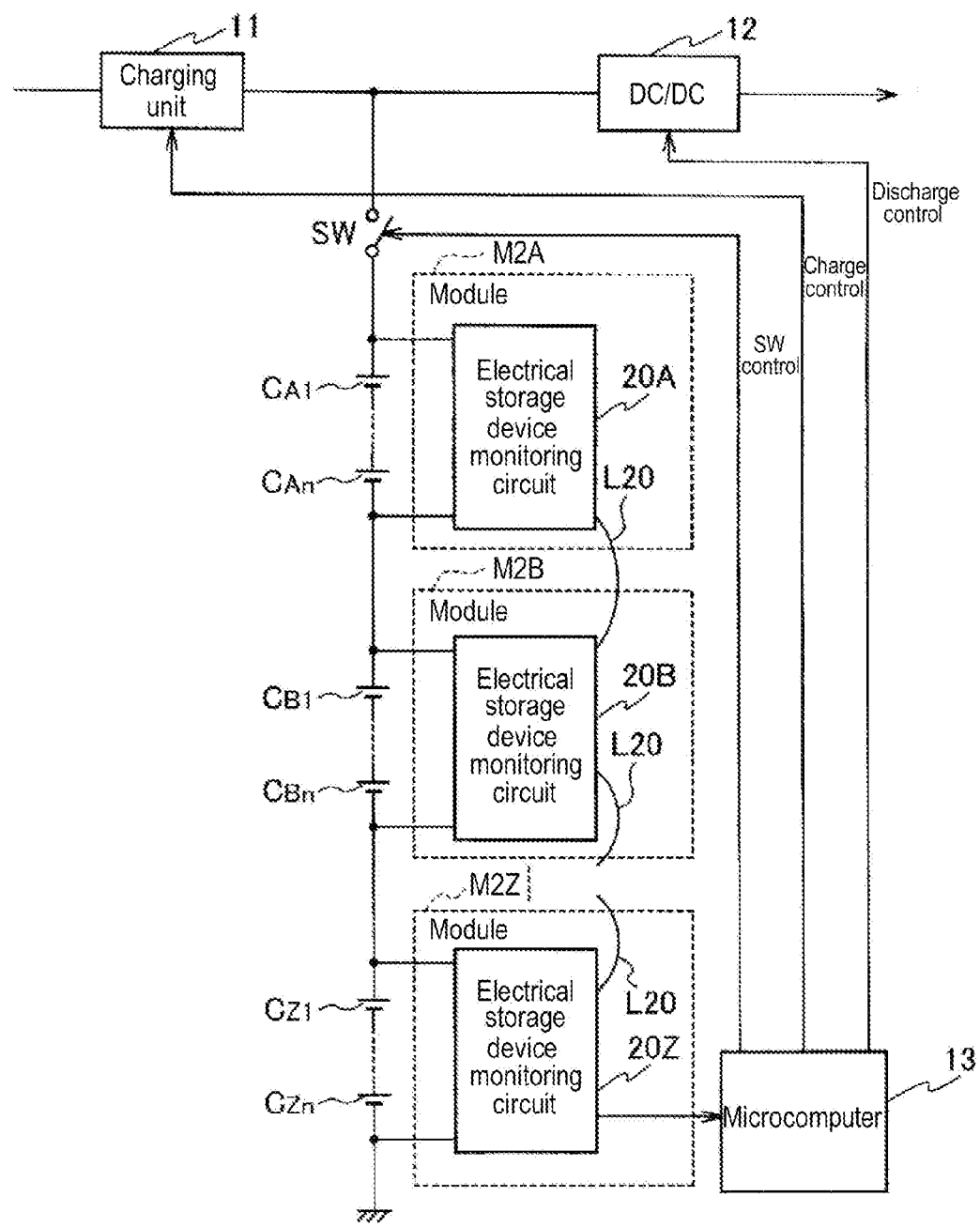
FIG. 8 is a view illustrating a modified example of a case in which the electrical storage device monitoring circuit according to the first embodiment is modularized.

In FIG. 1, the electrical storage devices $C_{A1}$ to $C_{An}$ and the electrical storage device monitoring circuit 20A are modularized, but a modularization range is not limited thereto. For example, as illustrated in FIG. 8, a range excluding the electrical storage devices $C_{A1}$ to $C_{An}$ may be modularized to form the module M2A. Such structure of the module M2A is the same in the other electrical storage devices $C_{B1}$ to $C_{Bn}$, ..., $C_{Z1}$ to $C_{Zn}$ and the electrical storage device monitoring circuits 20B, ..., 20Z.

As described above, according to the first embodiment, when the wiring L20 is disconnected, the disconnection fault may be detected, and thus the recovery processing may be performed. In addition, since the simple scheme without a register is employed, costs may be reduced and the circuit may also be miniaturized.

Second Embodiment

In the first embodiment, the recovery processing is performed without discriminating whether an operating fault such as overvoltage is occurred or a disconnection fault is occurred. In the second embodiment, in order to discriminate between an operating fault such as overvoltage and a disconnection fault, the following configuration is employed.

<Electrical Storage Device Monitoring Circuit>

Figure 9:
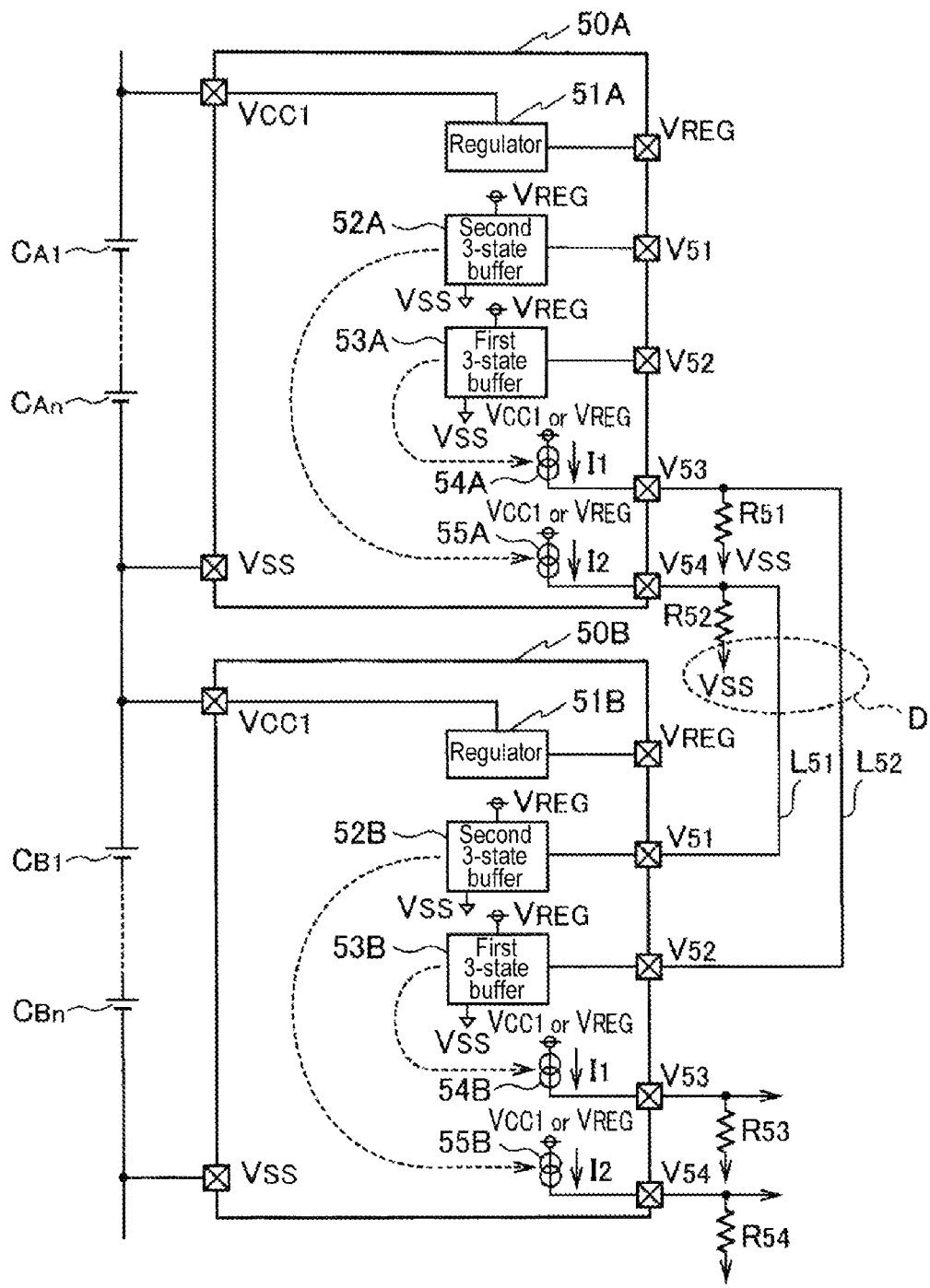
FIG. 9 is a schematic block diagram illustrating a configuration of an electrical storage device monitoring circuit according to a second embodiment.
Figure 10:
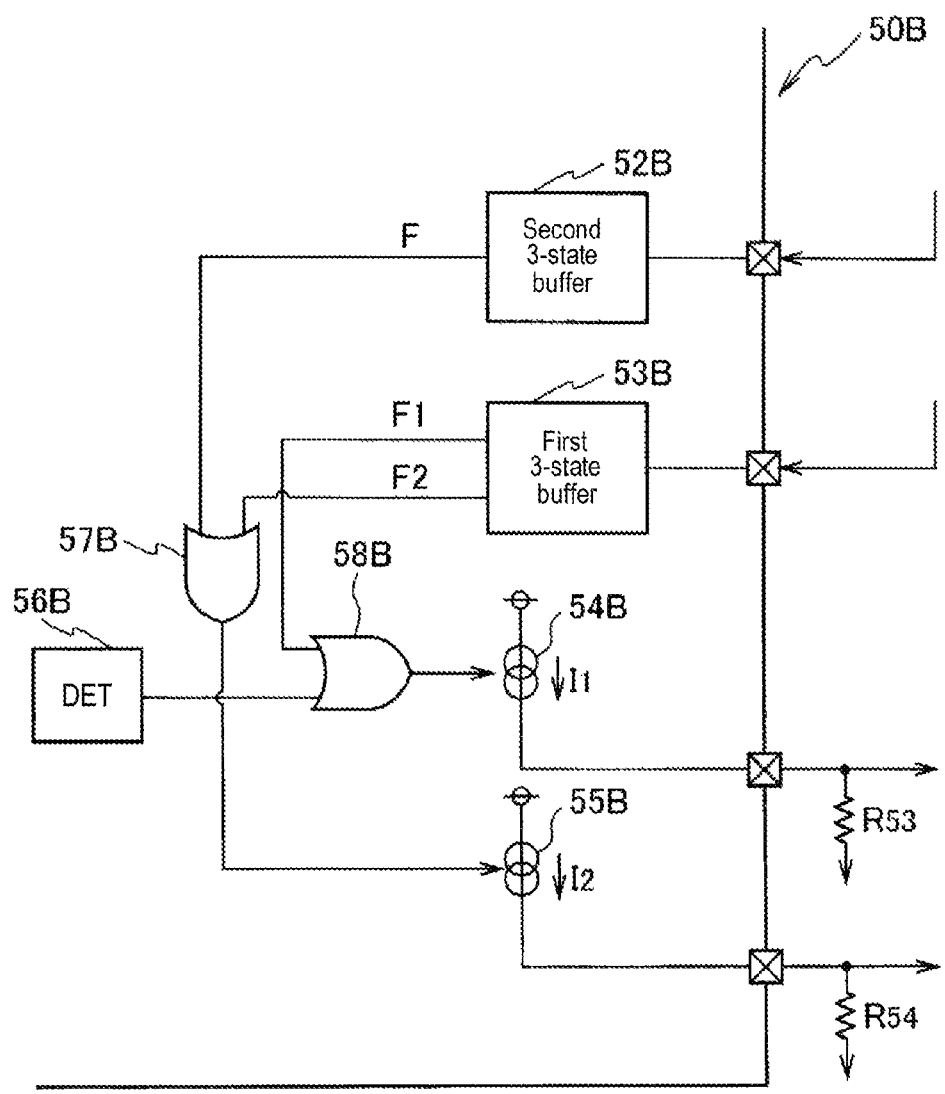
FIG. 10 is a schematic block diagram illustrating a detailed configuration of a major part of the electrical storage device monitoring circuit illustrated in FIG. 9.

A schematic block diagram of an electrical storage device monitoring circuit 50B according to the second embodiment is illustrated in FIG. 9, and a detailed schematic block diagram of a major part thereof is illustrated in FIG. 10. As illustrated in FIGS. 9 and 10, the electrical storage device monitoring circuit 50B according to the second embodiment includes a first 3-state buffer 53B and a second 3-state buffer 52B. The first 3-state buffer 53B switches between a high and low output state based on a first flag output F1 delivered from an electrical storage device monitoring circuit 50A at a front stage, and detects a disconnection between the electrical storage device monitoring circuit 50B and the electrical storage device monitoring circuit 50A at the front stage. On the other hand, the second 3-state buffer 52B switches between a high and low output state based on a second flag output F2 delivered from the electrical storage device monitoring circuit 50A at the front stage, and detects a disconnection between the electrical storage device monitoring circuit 50B and the electrical storage device monitoring circuit 50A at the front stage.

Further, the electrical storage device monitoring circuit 50B according to the second embodiment includes a first output circuit 54B and a second output circuit 55B. The first output circuit 54B delivers a first flag output F1 to an electrical storage device monitoring circuit 50C at a next stage based on an input of the first 3-state buffer 53B and a detection result of a detection circuit 56B. Meanwhile, the second output circuit 55B delivers a second flag output F2 to the electrical storage device monitoring circuit 50C at the next stage based on the input of the first 3-state buffer 53B and an input of the second 3-state buffer 52B.

Specifically, when the input of the first 3-state buffer 53B is high, the first output circuit 54B turns on the first flag output F1, and when the input of the first 3-state buffer 53B is low or high impedance, the first output circuit 54B turns off the first flag output F1. More specifically, when the output of the detection circuit 56B is a high level or the flag output F1 of the first 3-state buffer 53B is a high level, an output of a first OR circuit 58B is a high level and the first output circuit 54B allows a current $I_1$ to flow. And, when the output of the detection circuit 56B is a low level and the flag output F1 of the first 3-state buffer 53B is a low level, the output of the first OR circuit 58B is a low level and the first output circuit 54B does not allow the current $I_1$ to flow.

Meanwhile, when the input of the second 3-state buffer 52B is high impedance, the second output circuit 55B turns on the second flag output F2, and when the input of the second 3-state buffer 52B is high or low, the second output circuit 55B turns off the second flag output F2. Further, when the flag output F of the second 3-state buffer 52B is a high level or the flag output F2 of the first 3-state buffer 53B is a high level, an output of a second OR circuit 57B is a high level and the second output circuit 55B allows a current $I_2$ to flow. And, when the flag output F of the second 3-state buffer 52B is a low level and the flag output F2 of the first 3-state buffer 53B is a low level, the output of the second OR circuit 57B is a low level and the second output circuit 55B does not allow the current $I_2$ to flow.

<Input/Output Logic>

An input/output logic of the electrical storage device monitoring circuit 50B according to the second embodiment is illustrated in FIG. 11. As illustrated in FIG. 11, when an input of the first 3-state buffer 53B is high, the first flag output F1 is turned on. And, when the input of the first 3-state buffer 53B is a low level or high impedance, the first flag output F1 is turned off.

Turning on the first flag output F1 corresponds to the first output circuit 54B allowing the current $I_1$ to flow. And, turning off the first flag output F1 corresponds to the first output circuit 54B not allowing the current $I_1$ to flow. Accordingly, the microcomputer 13 may monitor the current $I_1$ (the first flag output F1) output from the electrical storage device monitoring circuit 50Z at the final stage, thus detecting an operating fault such as overcharge.

Meanwhile, as illustrated in FIG. 11, when the input of the first 3-state buffer 53B is high or low, the second flag output F2 is turned off. And, when the input of the first 3-state buffer 53B is high impedance, the second flag output F2 is turned on.

Turning on the second flag output F2 corresponds to the second output circuit 55B allowing the current $I_2$ to flow. And, turning off the second flag output F2 corresponds to the second output circuit 55B not allowing the current $I_2$ to flow. Accordingly, the microcomputer 13 may monitor the current $I_2$ (the second flag output F2) output from the electrical storage device monitoring circuit 50Z at the final stage, thus detecting a disconnection fault.

Further, an input/output logic of the second 3-state buffer 52B is illustrated in FIG. 6. That is, when an input of the second 3-state buffer 52B is high or high impedance, the current $I_2$ is output to flow, and when the input of the second 3-state buffer 52B is low, the current $I_2$ is not output to flow.

<Example of Recovery Processing>

Next, the recovery processing of a charging system according to the second embodiment will be described with reference to FIG. 12.

Figure 12:
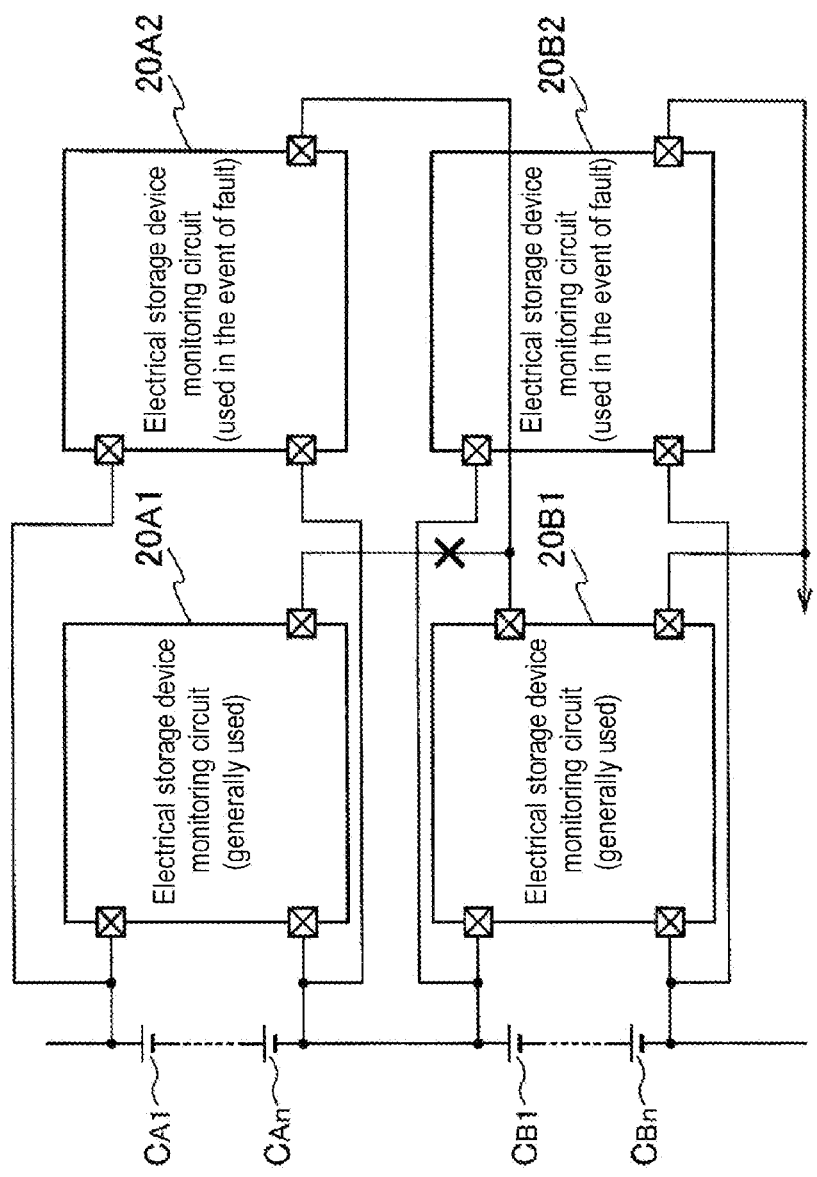
FIG. 12 is a view illustrating a recovery process of a charging system according to the second embodiment.

As illustrated in FIG. 12, in a charging system according to the second embodiment, electrical storage device monitoring circuits 20A1, 20B1, ..., 20Z1 which are generally used and electrical storage device monitoring circuits 20A2, 20B2, ..., 20Z2 which are used in the event of a fault are provided. In this state, it is assumed that a wiring connecting the electrical storage device monitoring circuit 20A1 and the electrical storage device monitoring circuit 20B1 is disconnected. In this case, both inputs of the first 3-state buffer 53B and the second 3-state buffer 52B are high impedance, and thus, the second flag output F2 is turned on.

When the second flag output F2 is turned on, the microcomputer 13 switches the electrical storage device monitoring circuits 20A1, 20B1, ..., 20Z1, which are generally used, to the electrical storage device monitoring circuits 20A2, 20B2, . . . , 20Z2, which are used in the event of a fault. Accordingly, when a disconnection fault is detected, the operation may be continued without having to stop the supply of the charge current $I_{chg}$ or lower the charge voltage $I_{chg}$. Such recovery processing is effective when it is required to constantly monitor the electrical storage devices $C_{A1}$ to $C_{An}$, $C_{B1}$ to $C_{Bn}$, . . . , $C_{Z1}$ to $C_{Zn}$.

In the second embodiment, the recovery processing when the first flag output F1 is in an ON state is the same as that of the first embodiment. That is, when an operating fault such as overvoltage is detected, the supply of the charge current $I_{chg}$ may be stopped or the charge voltage $I_{chg}$ may be lowered, as in the first embodiment.

As described above, according to the second embodiment, since an operating fault such as overvoltage and a disconnection fault may be discriminated, an appropriate recovery processing may be performed according to a type of fault.

<EDLC Internal Electrode>

Figure 13:
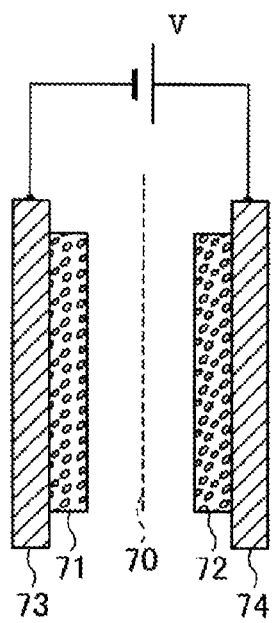
FIG. 13 is a schematic plan pattern view illustrating a basic structure of an internal electrode of an EDLC (Electric Double Layer Capacitor) as an electrical storage device provided in the electrical storage device monitoring circuit according to the first or second embodiment.

An electric double layer capacitor (EDLC) cell may be used as the electrical storage devices $C_{A1}$ to $C_{An}$, $C_{B1}$ to $C_{Bn}$, . . . , $C_{Z1}$ to $C_{Zn}$ provided in the electrical storage device monitoring circuit 20 according to the first or second embodiment, and a basic structure of an ELDC internal electrode is illustrated in FIG. 13. As illustrated in FIG. 13, the EDLC internal electrode is configured such that a separator 70 allowing only an electrolyte and ions to pass therethrough is interposed between active material electrodes 71 and 72 of at least one layer to allow lead-out electrodes 73 and 74 to be exposed from the active material electrodes 71 and 72, and the lead-out electrodes 73 and 74 are connected to a source voltage. The lead-out electrodes 73 and 74 are formed of an aluminum foil, for example, and the active material electrodes 71 and 72 are formed of active carbon, for example. The separator 70 is larger than the active material electrodes 71 and 72 (i.e., a separator having a large area) to cover the entirety of the active material electrodes 71 and 72. In general, the separator 70 is not dependent upon a type of energy device. However, when it is required to deal with the reflow, the separator 70 is required to have heat resistance. When the heat resistance is not required, the separator 70 may be formed of polypropylene, or the like, and when heat resistance is required, the separator 70 may be formed of a cellulose-based material. The EDLC internal electrode is impregnated with an electrolyte, and the electrolyte and ions are moved through the separator 70 during charging and discharging.

<Lithium Ion Capacitor Internal Electrode>

Figure 14:
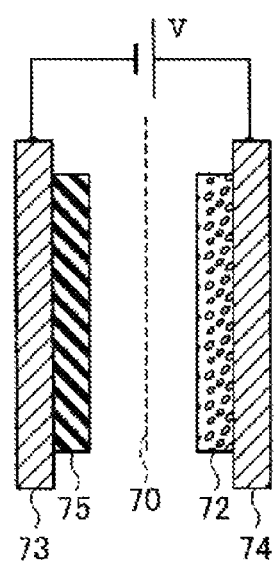
FIG. 14 is a schematic plan pattern view illustrating a basic structure of an internal electrode of a lithium ion capacitor as an electrical storage device provided in the electrical storage device monitoring circuit according to the first or second embodiment.

A lithium ion capacitor cell may be used as the electrical storage devices $C_{A1}$ to $C_{An}$, $C_{B1}$ to $C_{Bn}$, . . . , $C_{Z1}$ to $C_{Zn}$ provided in the electrical storage device monitoring circuit 20 according to the first or second embodiment, and a basic structure of the lithium ion capacitor internal electrode is illustrated in FIG. 14. As illustrated in FIG. 14, the lithium ion capacitor internal electrode is configured such that the separator 70 allowing only an electrolyte and ions to pass therethrough is interposed between active material electrodes 75 and 72 of at least one layer to allow lead-out electrodes 73 and 74 to be exposed from the active material electrodes 75 and 72, and the lead-out electrodes 73 and 74 are connected to a source voltage. The active material electrode 72 of an anode side is formed of active carbon, for example, and the active material electrode 75 of a cathode side is formed of Li doped carbon, for example. The lead-out electrode 74 of the anode side is formed of an aluminum foil, for example, and the lead-out electrode 73 of the cathode side is formed of copper foil, for example. The separator 70 is larger than the active material electrodes 75 and 72 (i.e., a separator having a large area) to cover the entirety of the active material electrodes 75 and 72. The lithium ion capacitor internal electrode is impregnated with an electrolyte, and the electrolyte and ions are moved through the separator 70 during charging and discharging.

<Lithium Ion Battery Internal Electrode>

Figure 15:
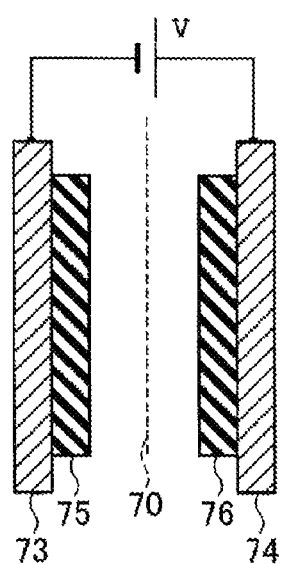
FIG. 15 is a schematic plan pattern view illustrating a basic structure of an internal electrode of a lithium ion battery as an electrical storage device provided in the electrical storage device monitoring circuit according to the first or second embodiment.

A lithium ion battery cell may be used as the electrical storage devices $C_{A1}$ to $C_{An}$, $C_{B1}$ to $C_{Bn}$, . . . , $C_{Z1}$ to $C_{Zn}$ provided in the electrical storage device monitoring circuit 20 according to the first or second embodiment, and a basic structure of the lithium ion battery internal electrode is illustrated in FIG. 15. As illustrated in FIG. 15, the lithium ion battery internal electrode is configured such that the separator 70 allowing only an electrolyte and ions to pass therethrough is interposed between active material electrodes 75 and 76 of at least one layer to allow lead-out electrodes 73 and 74 to be exposed from the active material electrodes 75 and 76, and the lead-out electrodes 73 and 74 are connected to a source voltage. The active material electrode 76 of an anode side is formed of $LiCoO_2$, for example, and the active material electrode 75 of a cathode side is formed of Li doped carbon, for example. The lead-out electrode 74 of the anode side is formed of an aluminum foil, for example, and the lead-out electrode 73 of the cathode side is formed of copper foil, for example. The separator 70 is larger than the active material electrodes 75 and 76 (i.e., a separator having a large area) to cover the entirety of the active material electrodes 75 and 76. The lithium ion capacitor internal electrode is impregnated with an electrolyte, and the electrolyte and ions are moved through the separator 70 during charging and discharging.

As mentioned above, according to the present disclosure, it is possible to provide an electrical storage device monitoring circuit capable of detecting a disconnection fault, a charging system, and an integrated circuit.

Other Embodiments

As described above, the present disclosure has been described by the first and second embodiments, but it should understood that descriptions and drawings constituting parts of the present disclosure are merely illustrative, and do not limit the present disclosure. It will be obvious that various alternative embodiments, examples, and operating techniques may be made by a person skilled in the art from the present disclosure.

Thus, the present disclosure encompasses various embodiments and the like not disclosed herein. For example, the present disclosure may be implemented as an integrated circuit incorporating a portion or all of the electrical storage device monitoring circuit 20A.

The electrical storage device monitoring circuit, the charging system, and the integrated circuit according to the present disclosure may be used in various devices requiring monitoring of an electrical storage device such as a vehicle-mounted battery, an energy recovery system, a momentary drop countermeasure device, or an uninterruptible power supply (UPS). Also, a lithium ion battery cell, an electric double layer capacitor cell, a lithium ion capacitor cell, SCiB® cell, or the like may be used as the electrical storage device.

According to an electrical storage device monitoring circuit, a charging system, and an integrated circuit of the present disclosure, it is possible to detect a disconnection fault.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An electrical storage device monitoring circuit, comprising:
   a 3-state buffer configured to switch between a high output state and a low output state based on a flag output delivered from a previous electrical storage device monitoring circuit at a front stage, and also configured to detect a disconnection between the electrical storage device monitoring circuit and the previous electrical storage device monitoring circuit at the front stage;
   a detection circuit configured to monitor an electrical storage device to detect whether the electrical storage device is normal or abnormal; and
   an output circuit configured to deliver the flag output to a subsequent electrical storage device monitoring circuit at a next stage based on an input of the 3-state buffer and a detection result of the detection circuit.

2. The electrical storage device monitoring circuit of claim 1, wherein the output circuit is configured to turn on the flag output when the input of the 3-state buffer is high or high impedance, and turn off the flag output when the input of the 3-state buffer is low.

3. The electrical storage device monitoring circuit of claim 1, wherein a pull-down resistor used for the 3-state buffer is deposited in the vicinity of the previous electrical storage device monitoring circuit at the front stage.

4. The electrical storage device monitoring circuit of claim 3, wherein the pull-down resistor used for the 3-state buffer is deposited in a module incorporating the previous electrical storage device monitoring circuit at the front stage.

5. The electrical storage device monitoring circuit of claim 1, wherein the electrical storage device is one of a lithium ion battery cell, an electric double layer capacitor cell, and a lithium ion capacitor cell.

6. An integrated circuit comprising the electrical storage device monitoring circuit according to claim 1.

7. An electrical storage device monitoring circuit comprising:
   a first 3-state buffer configured to switch between a high output state and a low output state based on a first flag output delivered from a previous electrical storage device monitoring circuit at a front stage, and also configured to detect a disconnection between the electrical storage device monitoring circuit and the previous electrical storage device monitoring circuit at the front stage;
   a second 3-state buffer configured to switch between a high output state and a low output state based on a second flag output delivered from the previous electrical storage device monitoring circuit at the front stage, and also configured to detect the disconnection between the electrical storage device monitoring circuit and the previous electrical storage device monitoring circuit at the front stage;
   a detection circuit configured to monitor an electrical storage device to detect whether the electrical storage device is normal or abnormal;
   a first output circuit configured to deliver the first flag output to a subsequent electrical storage device monitoring circuit at a next stage based on an input of the first 3-state buffer and a detection result of the detection circuit; and
   a second output circuit configured to deliver the second flag output to the subsequent electrical storage device monitoring circuit at the next stage based on the input of the first 3-state buffer and an input of the second 3-state buffer.

8. The electrical storage device monitoring circuit of claim 7, wherein the first output circuit is configured to turn on the first flag output when the input of the first 3-state buffer is high, and turn off the first flag output when the input of the first 3-state buffer is low or high impedance.

9. The electrical storage device monitoring circuit of claim 7, wherein the second output circuit is configured to turn on the second flag output when the input of the second 3-state buffer is high impedance, and turn off the second flag output when the input of the second 3-state buffer is high or low.

* * * * *